United States Patent
Tseng

(10) Patent No.: US 7,644,895 B2
(45) Date of Patent: Jan. 12, 2010

(54) CLAMPING DEVICE FOR ELECTRONIC PRODUCTS

(76) Inventor: Min-Li Tseng, P.O. Box 6-9 717, Tainan (TW)

( * ) Notice: Subject to any disclaimer, the term of this patent is extended or adjusted under 35 U.S.C. 154(b) by 0 days.

(21) Appl. No.: 11/975,376

(22) Filed: Oct. 22, 2007

(65) Prior Publication Data

US 2009/0101782 A1    Apr. 23, 2009

(51) Int. Cl.
*A47G 29/00* (2006.01)
(52) U.S. Cl. ........................ 248/126; 248/560; 248/918; 224/575; 224/577
(58) Field of Classification Search ................. 248/126, 248/560, 918; 224/575, 577, 581, 584, 586
See application file for complete search history.

(56) References Cited

U.S. PATENT DOCUMENTS

| | | | | |
|---|---|---|---|---|
| 2,509,428 A | * | 5/1950 | Greene | 224/670 |
| 3,214,685 A | * | 10/1965 | Brenner | 224/152 |
| 5,210,532 A | * | 5/1993 | Knoedler et al. | 340/825.69 |
| 5,385,282 A | * | 1/1995 | Chen | 224/669 |
| 5,426,825 A | * | 6/1995 | Soren et al. | 24/3.12 |
| 5,512,880 A | * | 4/1996 | Abrams et al. | 340/573.4 |
| 6,550,655 B2 | * | 4/2003 | Warner | 224/575 |
| 6,729,518 B2 | * | 5/2004 | Badillo et al. | 224/578 |
| 7,098,813 B1 | * | 8/2006 | Hung et al. | 341/22 |
| 7,110,802 B1 | * | 9/2006 | Kim et al. | 455/575.6 |
| 7,270,255 B2 | * | 9/2007 | Badillo et al. | 224/577 |
| 2007/0099681 A1 | * | 5/2007 | Kielland | 455/575.1 |

* cited by examiner

*Primary Examiner*—Amy J Sterling

(57) ABSTRACT

A clamping device for electronic products includes a combining member and a clamping base that is made of elastic steel sheet having its outer periphery coated with a layer of soft rubber and its central portion bored with a combining hole. Thus, after the clamping base is combined with an electronic product by the combining member, the electronic product can be hung on a user's girdle by turning over the elastic steel sheet of the clamping base, and an earphone line can be wound on the steel sheet in a space between the clamping base and the electronic product, having great practicability and convenience in use.

6 Claims, 7 Drawing Sheets

CLAMPING DEVICE FOR ELECTRONIC PRODUCTS

BACKGROUND OF THE INVENTION

1. Field of the Invention

This invention relates to a clamping device for electronic products, particularly to one able to be hung on a user's girdle or employed for winding the earphone line of the electronic product thereon and also able to be placed on a table top as a display stand with an elevation angle, increasing variation in use of electronic products and having great practicability.

2. Description of the Prior Art

For the present, the capacity and the function of a cellular telephone and an iPod have continuously been elevated; therefore, a user not only can listen to music of MP3 but also can see movies through the liquid crystal screen of the cellular telephone or the iPod. However, a user has to hold the cellular telephone or the iPod with a hand (as shown in FIG. 1), or horizontally place the cellular telephone or the iPod on a table top for seeing movies on its screen, thus resulting in inconvenience for the user to see movies and walk about at the same time or disabling the user to see the movies at a good angle.

SUMMARY OF THE INVENTION

The objective of this invention is to offer a clamping device for electronic products, able to elevate variation in use of electronic products and facilitating the electronic products to be carried about.

The clamping device for electronic products in the present invention includes a combining member for combining and positioning an electronic product, and a clamping base to be combined with the electronic product by means of the combining member. The clamping base made of elastic steel sheet can be turned over outward and inward to be hung on a user's girdle or placed on a table at an elevation angle.

BRIEF DESCRIPTION OF DRAWINGS

This invention will be better understood by referring to the accompanying drawings, wherein.

DETAILED DESCRIPTION OF THE PREFERRED EMBODIMENT

Figure 1:
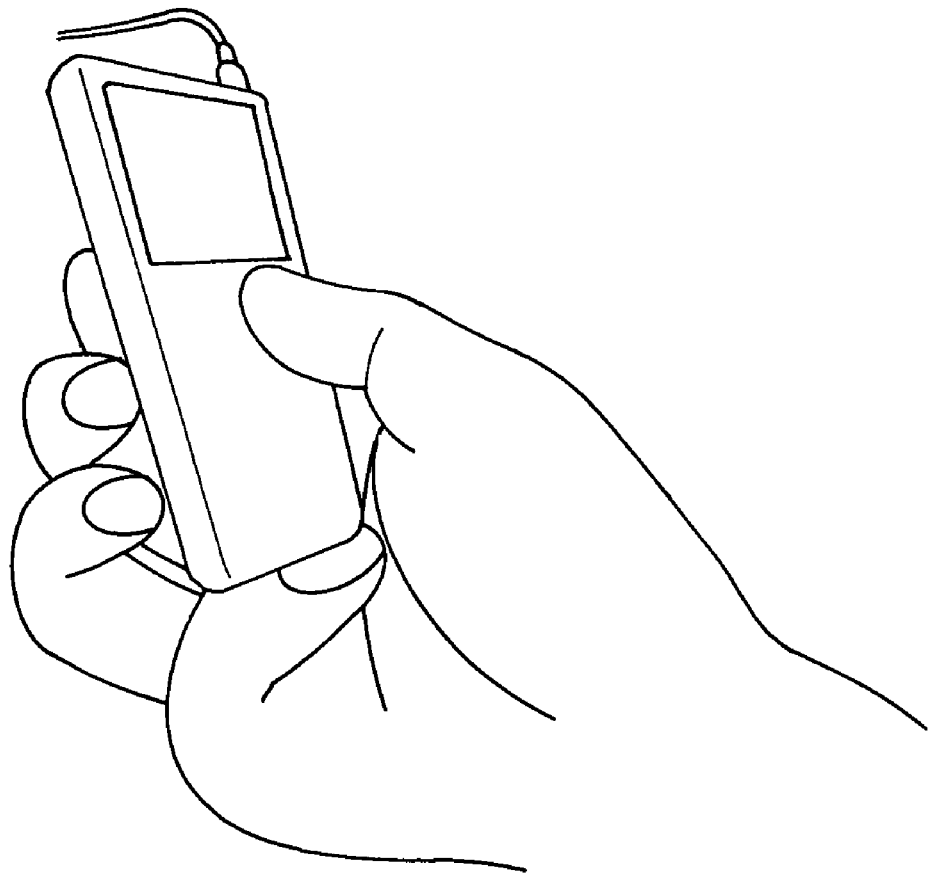
FIG. 1 is a perspective view of a conventional iPod in a using condition.
Figure 2:
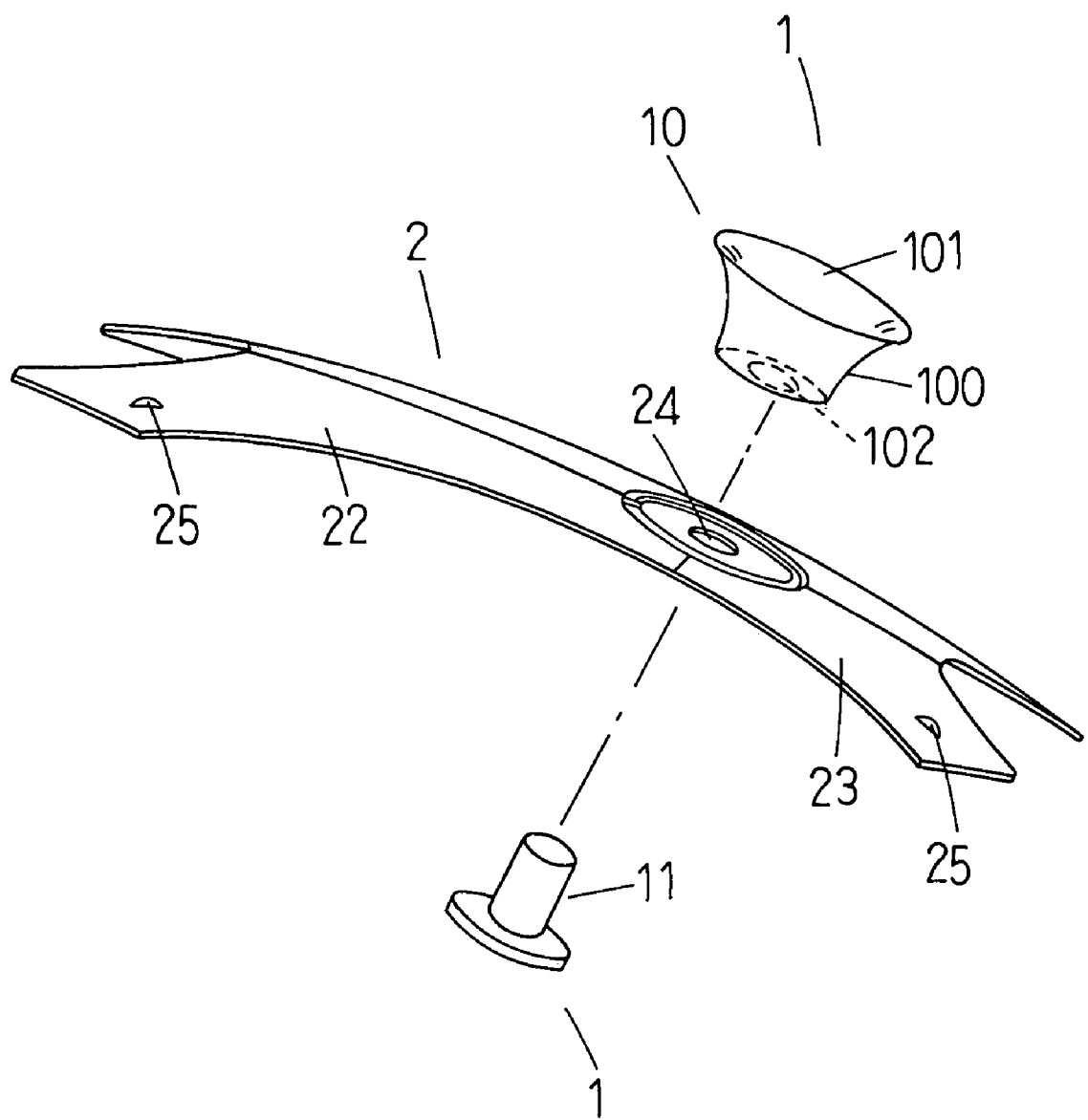
FIG. 2 is an exploded perspective view of a clamping device for electronic products in the present invention.
Figure 3:
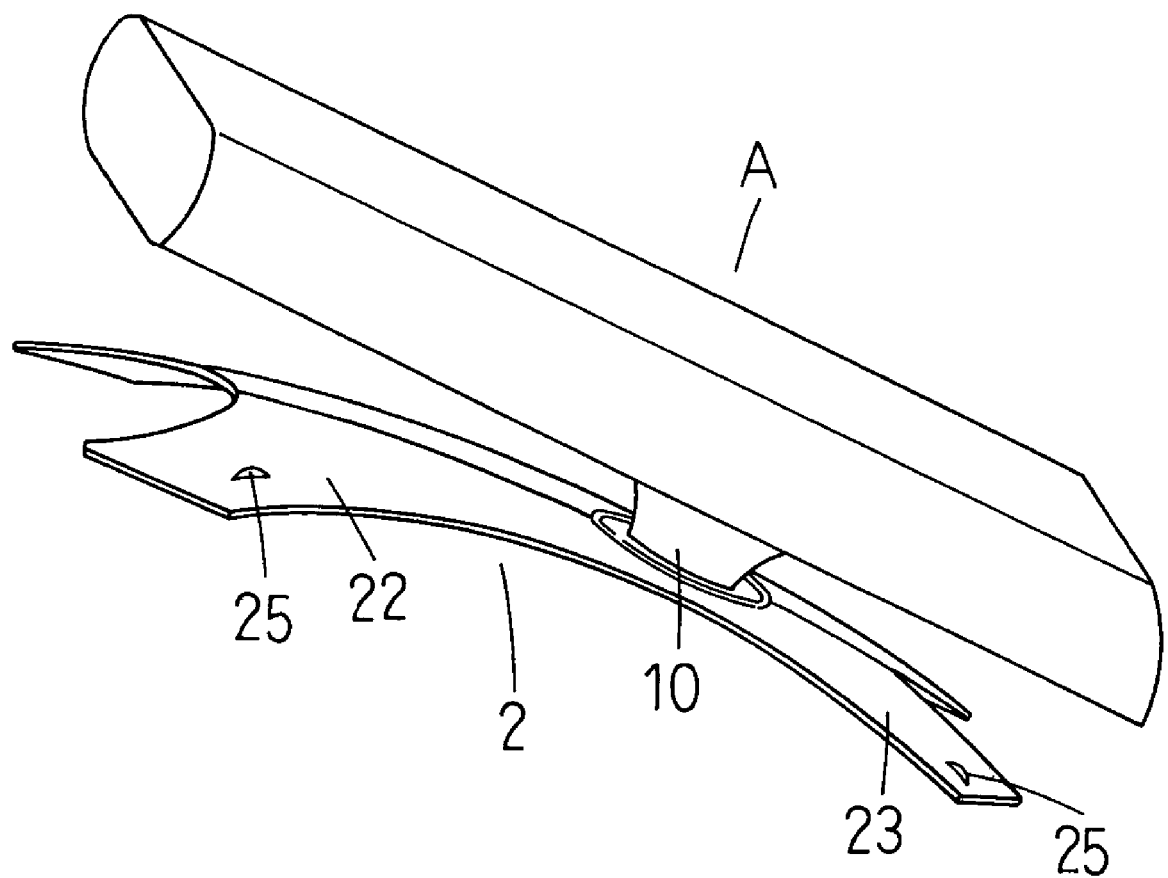
FIG. 3 is a perspective view of the clamping device combined with an electronic product in the present invention.
Figure 4:
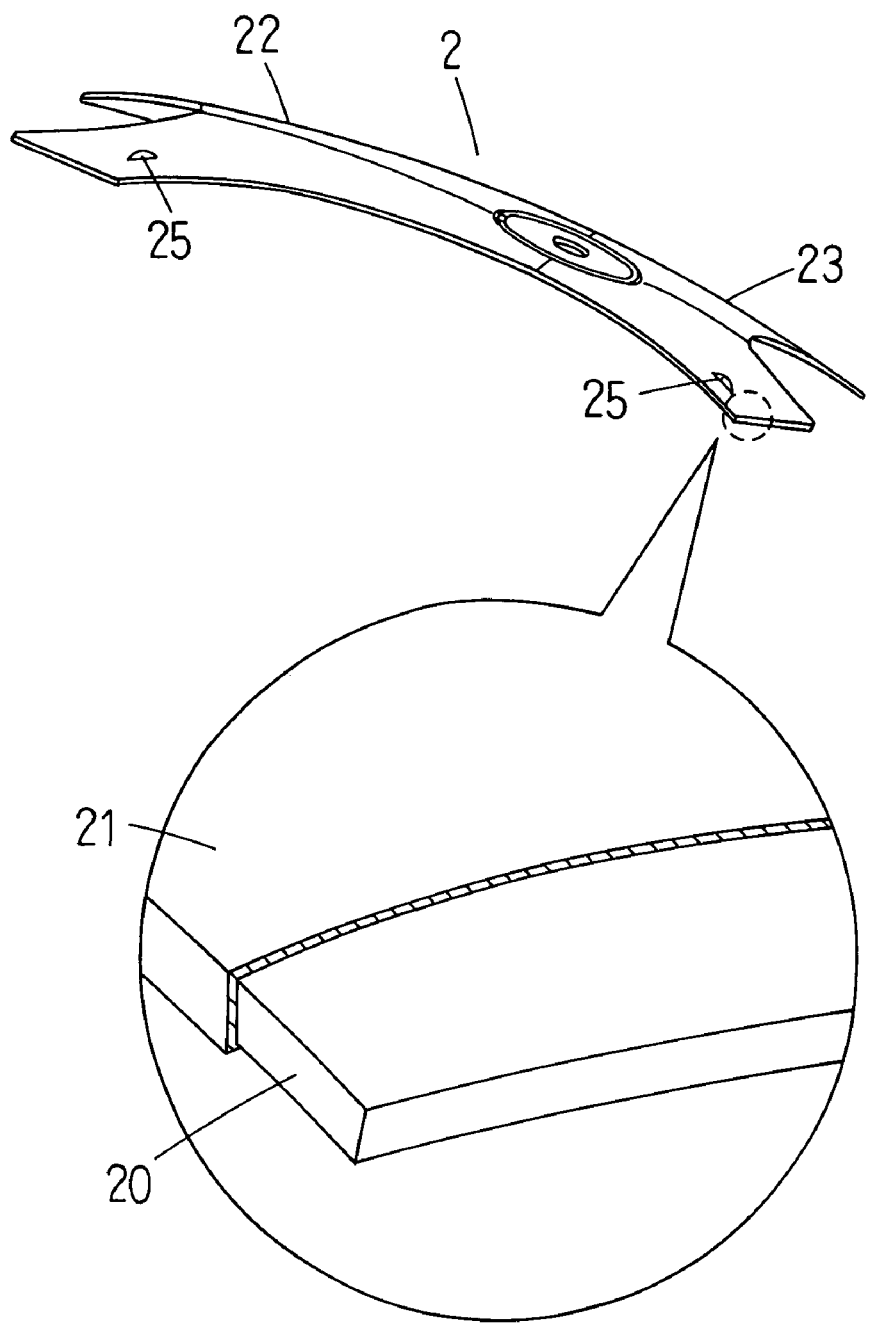
FIG. 4 is a partial cross-sectional view of the steel sheet of a clamping base in the present invention.
Figure 5:
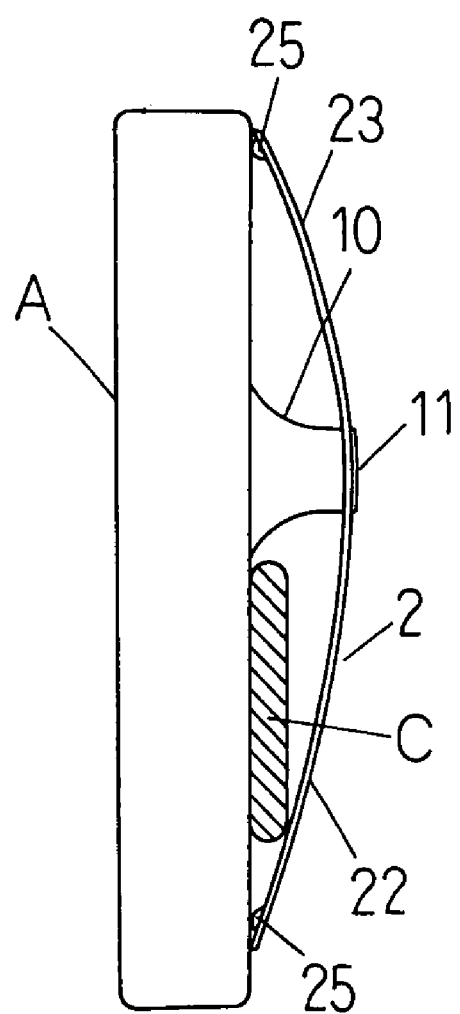
FIG. 5 is a side cross-sectional view of the clamping device together with the electronic product hung on a user's girdle in the present invention.
Figure 6:
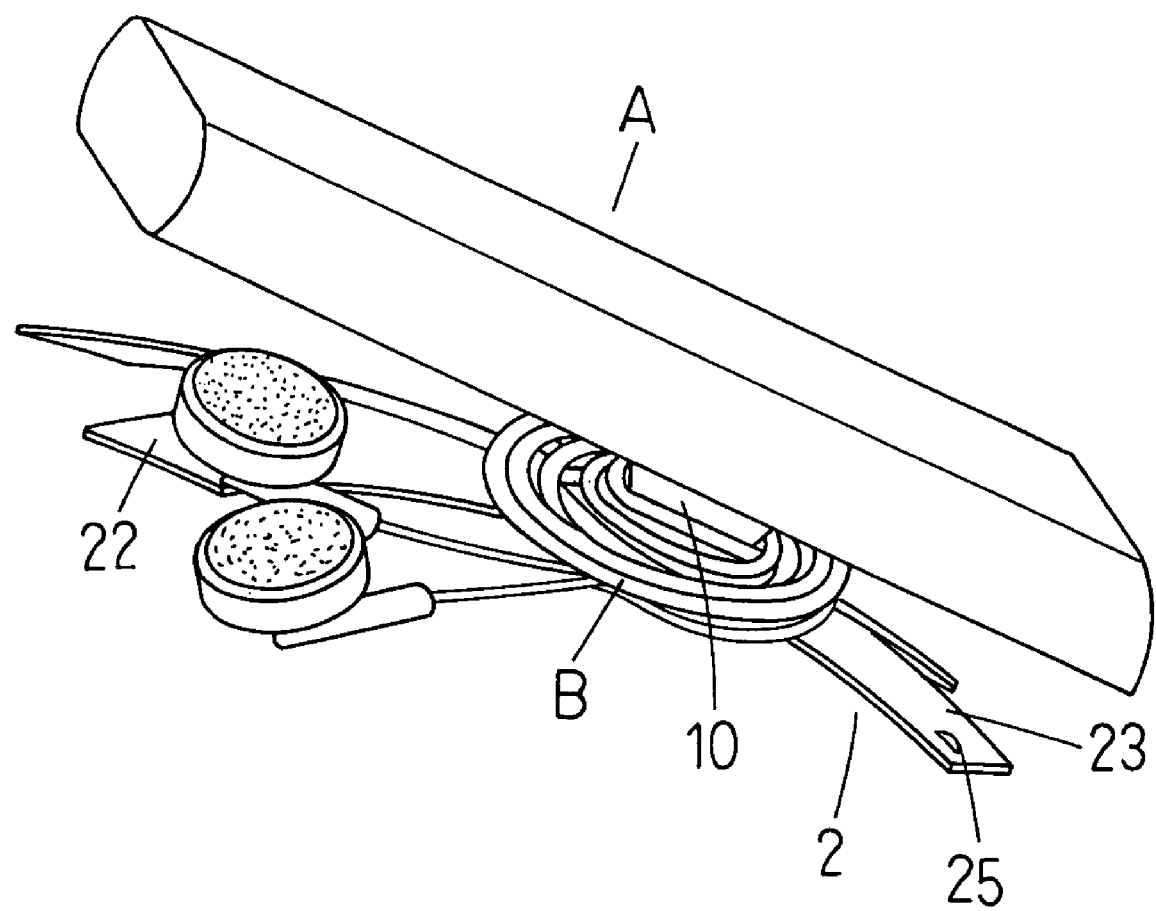
FIG. 6 is a perspective view of the clamping device combined with the electronic product in a first condition of having an earphone line wound up thereon in the present invention.
Figure 7:
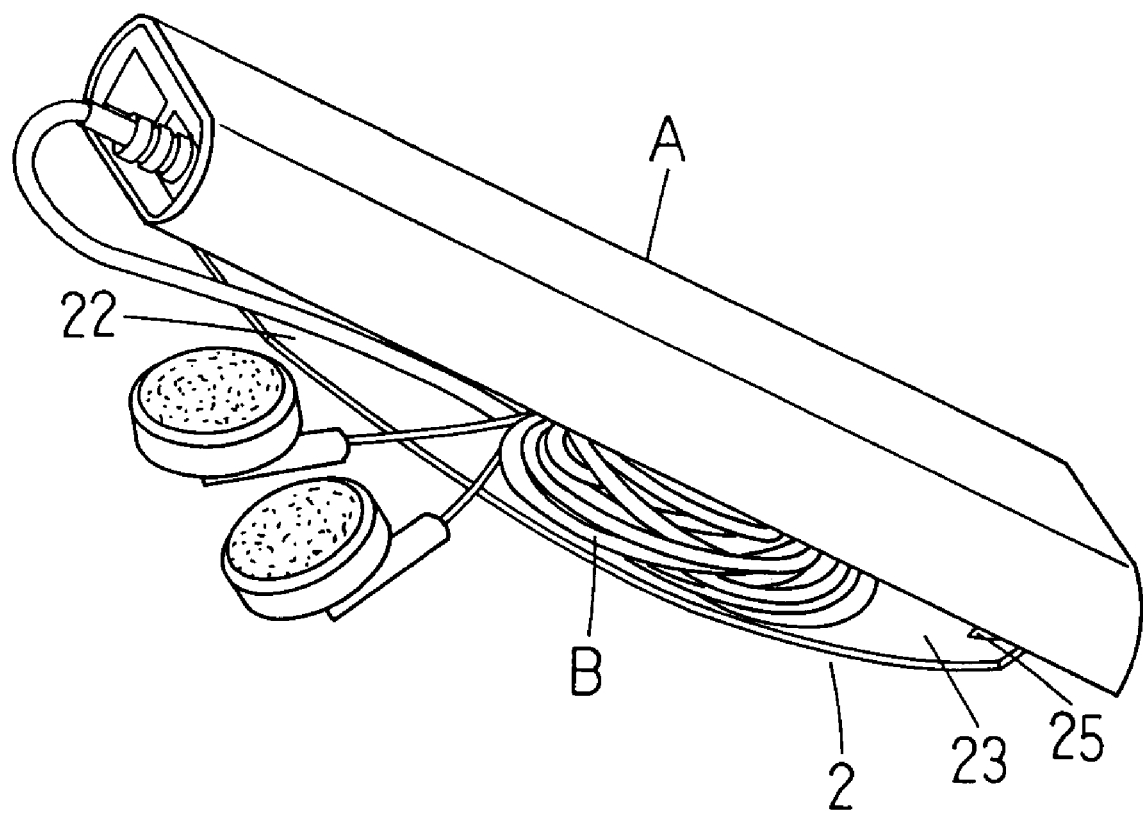
FIG. 7 is a perspective view of the clamping device combined with the electronic product in a second condition of having the earphone line wound up thereon in the present invention.

A preferred embodiment of a clamping device for electronic products in the present invention, as shown in FIGS. 2 to 7, includes a combining member 1 and a clamping base 2 combined together.

The combining member 1 is composed of a combining base 10 and a positioning element 11. The combining base 10 is provided with a trumpet-shaped neck 100, a combining surface 101 and a positioning hole 102.

The clamping base 2 is to be fixed with an electronic product (A) by means of the positioning element 11 and the combining base 10 of the combining member 1. The clamping member 2 is an arc-shaped body made of elastic steel sheet 20 having its outer periphery covered with soft rubber 21. Further, the clamping base 2 is symmetrically formed with an upper foot 22 and a lower foot 23 shorter than the upper foot 22 so that when placed on the clamping base 2, the electronic product (A) will form an elevation angle for facilitating seeing movies on the screen of the electronic product (A). Further, the clamping base 2 is bored with an insert hole 24 in the center, and has its upper foot 22 and its lower foot 23 respectively fixed thereon with a non-slip projection 25.

In combining, firstly, the electronic product (A) has its rear side firmly combined with the combining base 10 of the combining member 1. Next, the insert hole 24 of the clamping base 2 is coincided with the positioning hole 102 of the combining base 10 and the positioning element 11 is inserted and secured in both the insert hole 24 and the positioning hole 102 to combine the combining member 1 together with the clamping base 2.

When the electronic product (A) is to be hung on a user's waist for use, only turn over outward the elastic steel sheet 20 of the clamping base 2 and clamp it on the user's girdle (C) and then press inward the elastic steel sheet 20 to firmly position the electronic product (A) on the girdle (C). When the electronic product (A) is to be placed on a table top for use, simply turn over outward the elastic steel sheet 20 of the clamping base 2 to make up a holding stand with its front portion higher than its rear portion so that the screen of the electronic product (A) positioned on the clamping base 2 at an elevation angle can be seen easily. In addition, when the earphone line (B) is to be withdrawn, it can be wound on the combining base 10 between the clamping base 2 and the electronic product (A) and then the elastic steel sheet 20 is pressed inward to clamp and fix the earphone line (B) in position.

As can be understood from the above description, this invention has the following advantages.

1. The clamping base 2 can be easily clamped on a user's girdle (C) by turning over its elastic steel sheet 20 and also closely contact with the electronic product (A) by its non-slip projections 25, convenient to be carried about and placed on a table top.

2. The clamping base 2 positioned under can be turned over outward and placed on a table top to serve as a display stand with an elevation angle for facilitating a user to see movies on the screen of the electronic product (A) on the clamping base 2.

3. The earphone line of the electronic product (A) can be wound on the combining base 10 between the combining member 1 and the clamping base 2, meeting with a user's needs.

While the preferred embodiment of the invention has been described above, it will be recognized and understood that various modifications may be made therein and the appended claims are intended to cover all such modifications that may fall within the spirit and scope of the invention.

I claim:

1. A clamping device for electronic products comprising:
   a clamping base comprising an elastic sheet defining an upper foot and a lower foot; and
   a combining member disposed on said elastic sheet between said upper foot and said lower foot, the combining member being configured for combining and positioning an electronic product on one side of said elastic sheet;
   wherein said sheet is flexible between a first position wherein said elastic sheet is concave toward said electronic product and a second position wherein said elastic sheet is concave away from said electronic product;
   such that when said elastic sheet is in said first position, said elastic sheet is configured to clamp a user's belt between said elastic sheet and the electronic product, and when said elastic sheet is in said second position, said upper and lower feet extend away from the electronic product to form a stand.

2. The clamping device for electronic products as claimed in claim 1, wherein said elastic sheet is an elastic steel sheet having its outer surface covered with soft material for increasing its soft tactile impression.

3. The clamping device for electronic products as claimed in claim 1, wherein said clamping base is provided thereon with non-slip projections to enable said clamping base to be closely fixed on a user's belt.

4. The clamping device for electronic products as claimed in claim 1, wherein said combining member is composed of a combining base and a positioning element for combining said electronic product and said clamping base together.

5. The clamping device for electronic products as claimed in claim 1, wherein an earphone line wound on said combining base is positioned stably between said clamping base and said electronic product and clamped in position by said elastic sheet.

6. The clamping device for electronic products as claimed in claim 1, wherein said upper foot and said lower foot are unequal in length so as to form an elevation angle when said clamping base is placed on a table top, facilitating a user to see and enjoy movies on screen of said electronic product.

* * * * *